(12) United States Patent
Tsuchiko (10) Patent No.: US 6,833,586 B2
(45) Date of Patent: Dec. 21, 2004

(54) LDMOS TRANSISTOR WITH HIGH VOLTAGE SOURCE AND DRAIN TERMINALS

(75) Inventor: Hideaki Tsuchiko, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 37 days.

(21) Appl. No.: 10/336,567

(22) Filed: Jan. 2, 2003

(65) Prior Publication Data

US 2004/0140517 A1 Jul. 22, 2004

(51) Int. Cl.[7] .......................... H01L 29/76; H01L 23/58; H01L 29/94
(52) U.S. Cl. ....................... 257/343; 257/492; 257/493; 257/409
(58) Field of Search ................................. 257/493, 492, 257/343, 409, 488, 489, 490

(56) References Cited

U.S. PATENT DOCUMENTS

| | | | |
|---|---|---|---|
| 4,300,150 A | 11/1981 | Colak | 357/23 |
| 5,047,820 A | 9/1991 | Garnett | 357/23.8 |
| 5,406,110 A | 4/1995 | Kwon et al. | 257/493 |
| 5,517,046 A | 5/1996 | Hsing et al. | 257/336 |
| 5,854,566 A | 12/1998 | Kwon et al. | 327/403 |
| 6,096,589 A | 8/2000 | Lee et al. | 438/225 |
| 6,211,552 B1 | 4/2001 | Efland et al. | 257/343 |
| 6,242,787 B1 | 6/2001 | Nakayama et al. | 257/493 |
| 6,525,376 B1 * | 2/2003 | Harada et al. | 257/343 |

* cited by examiner

Primary Examiner—Steven Loke
(74) Attorney, Agent, or Firm—Patent Law Group LLP; Carmen C. Cook (57) ABSTRACT

An LDMOS transistor includes drift regions from the body to the drain and the source terminals and is capable of handling high voltages at both the source and drain terminals. In one embodiment, a transistor includes a body region formed in a first well, a conductive gate formed over a first dielectric layer where the first dielectric layer overlies the first well, a second dielectric layer encircling the first dielectric layer, a drain region abutting one edge of the second dielectric layer and a source region abutting an opposite edge of the second dielectric layer. A first drift region is formed between the source region and the body region while a second drift region is formed between the drain region and the body region. Accordingly, the drain and source region of the transistor is interchangeable. In one embodiment, the first and second dielectric layers are a contiguous field oxide layer.

37 Claims, 6 Drawing Sheets

LDMOS TRANSISTOR WITH HIGH VOLTAGE SOURCE AND DRAIN TERMINALS

FIELD OF THE INVENTION

The invention relates to lateral double-diffused metal-oxide-semiconductor (LDMOS) transistors and, in particular, to an N-type LDMOS transistor using a thick oxide layer as the gate dielectric.

DESCRIPTION OF THE RELATED ART

Figure 1:
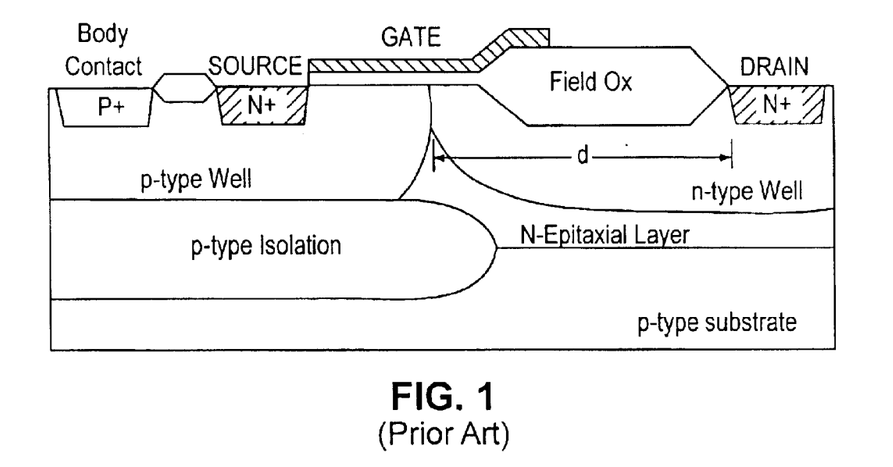
FIG. 1 is a cross-sectional view of a conventional N-type LDMOS transistor.

Lateral double-diffused metal-oxide-semiconductor (LDMOS) transistors are commonly used in high-voltage applications (20 to 500 volts) because of their high breakdown voltage characteristics and compatibility with CMOS technology for low voltage devices. FIG. 1 is a cross-sectional view of a conventional N-type LDMOS transistor. It is well known that by increasing the length of the drift region, denoted by the distance "d", the breakdown voltage of the LDMOS transistor can be accordingly increased.

Conventional LDMOS transistors are uni-directional devices. That is, the drain and source terminals of the conventional LDMOS transistors are not interchangeable. Referring to FIG. 1, the gate dielectric of the LDMOS transistor includes a gate oxide layer on top of the channel region (that is, the p-well body) of the LDMOS transistor. The drift region is formed between the channel region and the drain terminal. As a result of the non-symmetrical structure, only the drain terminal of the conventional LDMOS transistor is designed to handle high voltage. The source and gate terminals are not designed to withstand high voltages.

Thus, in the conventional LDMOS transistors, the drain to gate voltage, drain to source voltage and drain to substrate voltage can be high voltages while the gate to substrate voltage, the gate to source voltage and source to substrate voltage are limited to low voltages. Specifically, the gate to substrate voltage is limited by the breakdown voltage of the gate oxide layer. The gate to source voltage is limited to "gated" or "gate assisted" breakdown voltage of the LDMOS transistor. The source to substrate voltage is limited by the breakdown voltage of the junction associated with the source terminal. Hence, the gate and source voltage swing of the conventional LDMOS transistor is limited and the gate and source terminals of such conventional LDMOS transistors cannot be driven by a high voltage device.

Therefore, it is desirable to optimize the breakdown voltage characteristics of an LDMOS transistor such that the gate, source and drain terminals of the LDMOS transistor can all withstand high voltages.

SUMMARY OF THE INVENTION

A lateral double-diffused metal-oxide-semiconductor (LDMOS) transistor includes drift regions from the body to both the drain and the source terminals of the transistor such that both the drain and the source terminals are disposed to withstand high voltages.

In one embodiment, a transistor includes a semiconductor layer of a first conductivity type, a first well of a second conductivity type formed in the semiconductor layer where the first well forms a body region of the transistor, and a first dielectric layer formed on the top surface of the semiconductor layer where the first dielectric layer forms a gate dielectric layer of the transistor. A portion of the first dielectric layer is formed over the first well and remaining portions of the first dielectric layer is formed over the semiconductor layer on either side of the first well. The transistor further includes a second dielectric layer formed on the top surface of the semiconductor layer and encircling the first dielectric layer, a conductive gate formed over the first dielectric layer and located above the first well, a first region of the first conductivity type formed in the semiconductor layer abutting a first edge of the second dielectric layer, and a second region of the first conductivity type formed in the semiconductor layer abutting a second edge of the second dielectric layer opposite the first edge.

As thus formed, the transistor includes a first drift region between the body region and the first region and a second drift region between the body region and the second region. The first drift region is formed in the semiconductor layer between a first edge of the first well to the first edge of the second dielectric layer. The second drift region between the body region and the second region is formed in the semiconductor layer between a second edge of the first well, opposite the first edge of the first well, to the second edge of the second dielectric layer.

According to one aspect of the present invention, either the first region or the second region can be used to form a source region of the transistor. The other one of the first and second regions forms a drain region of the transistor. Accordingly, the drain and source region of the transistor is interchangeable.

According to another aspect of the present invention, the first dielectric layer and the second dielectric layer are formed as a contiguous field oxide layer. The field oxide layer can have a thickness of about 6500 Å.

According to another aspect of the present invention, the second dielectric layer is a field oxide layer and the first dielectric layer is an oxide layer having a thickness less than the field oxide layer. In one embodiment, the first dielectric layer is a thin gate oxide layer.

The present invention is better understood upon consideration of the detailed description below and the accompanying drawings.

DETAILED DESCRIPTION OF THE PREFERRED EMBODIMENTS

In accordance with the principles of the present invention, a lateral double-diffused metal-oxide-semiconductor (LDMOS) transistor includes drift regions from the body to both the drain and the source terminals of the transistor such that both the drain and the source terminals are disposed to withstand high voltages. In one embodiment, the LDMOS transistor employs a thick oxide layer as the gate dielectric. The use of a thick oxide layer as the gate dielectric enables the gate terminal of the LDMOS transistor to withstand high voltages. Accordingly, the thick oxide gate LDMOS transistor of the present invention can receive high voltages at all of its terminals, that is, the gate, drain and source terminals. In an alternate embodiment, the LDMOS transistor of the present invention is symmetrical in that both the drain and the source terminals can withstand the same level of high voltages and are thus interchangeable.

Figure 2A:
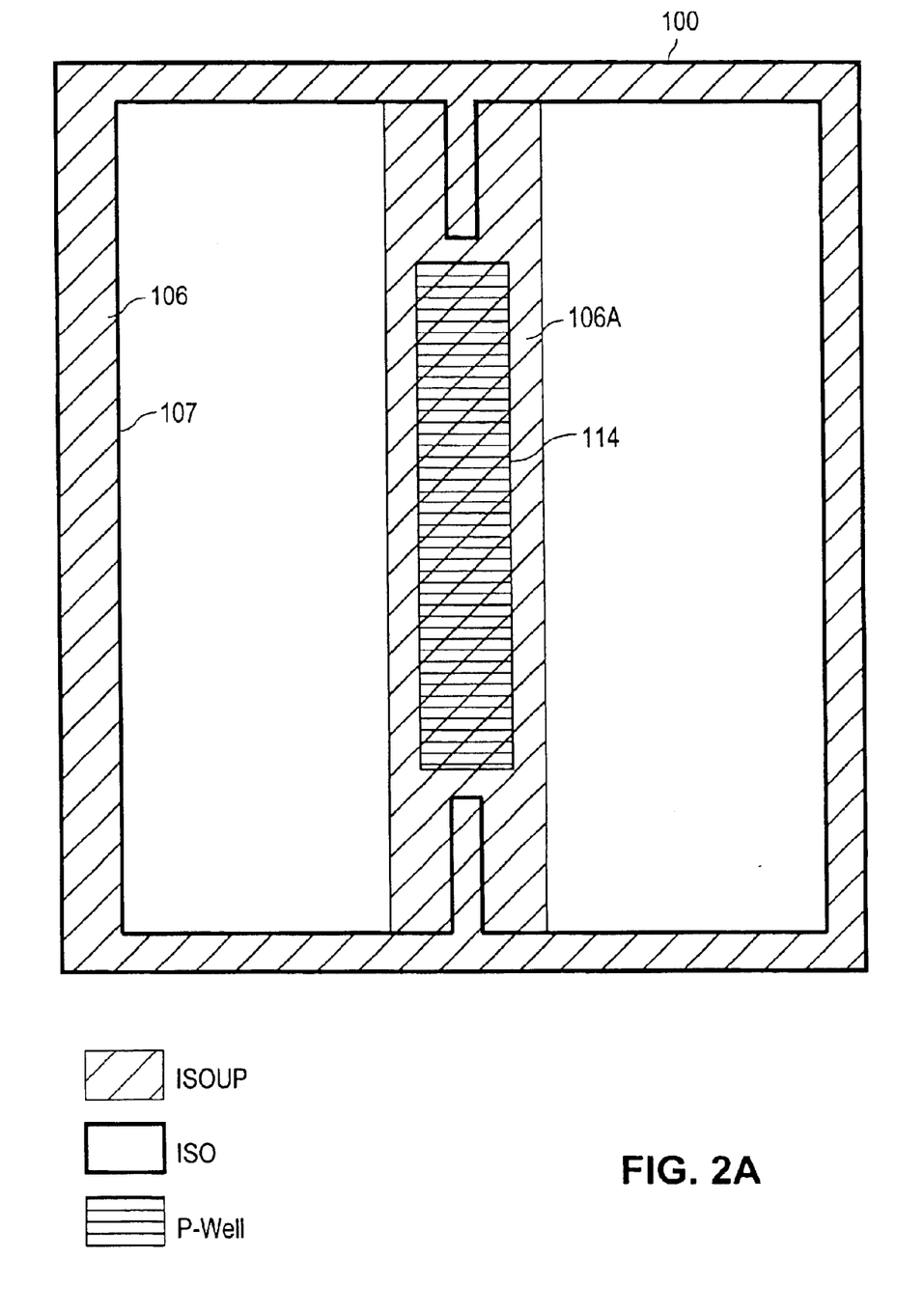
FIGS. 2A to 2C are top views of a field oxide gate N-type LDMOS transistor illustrating selected regions of the transistor according to one embodiment of the present invention.
Figure 2B:
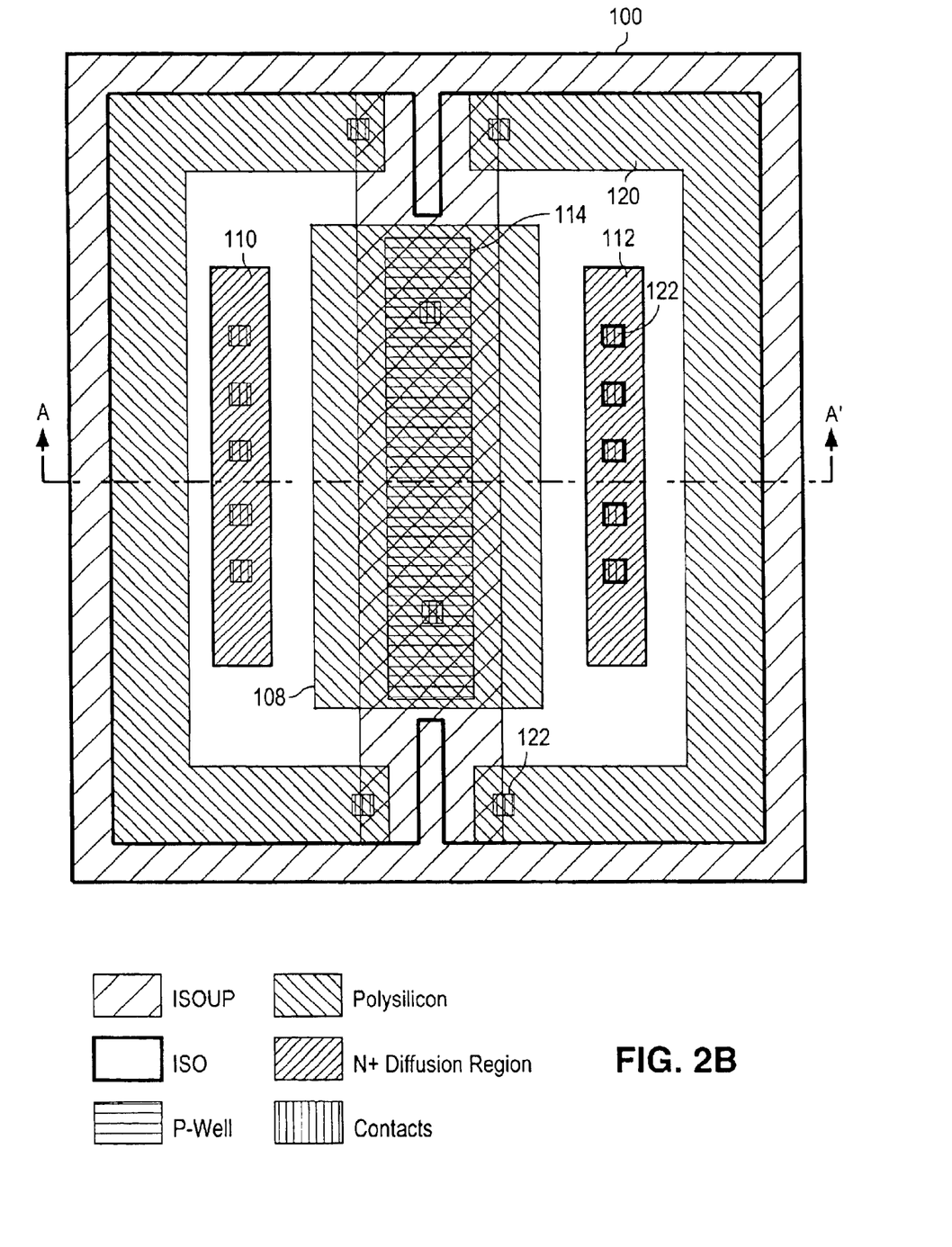
Figure 2C:
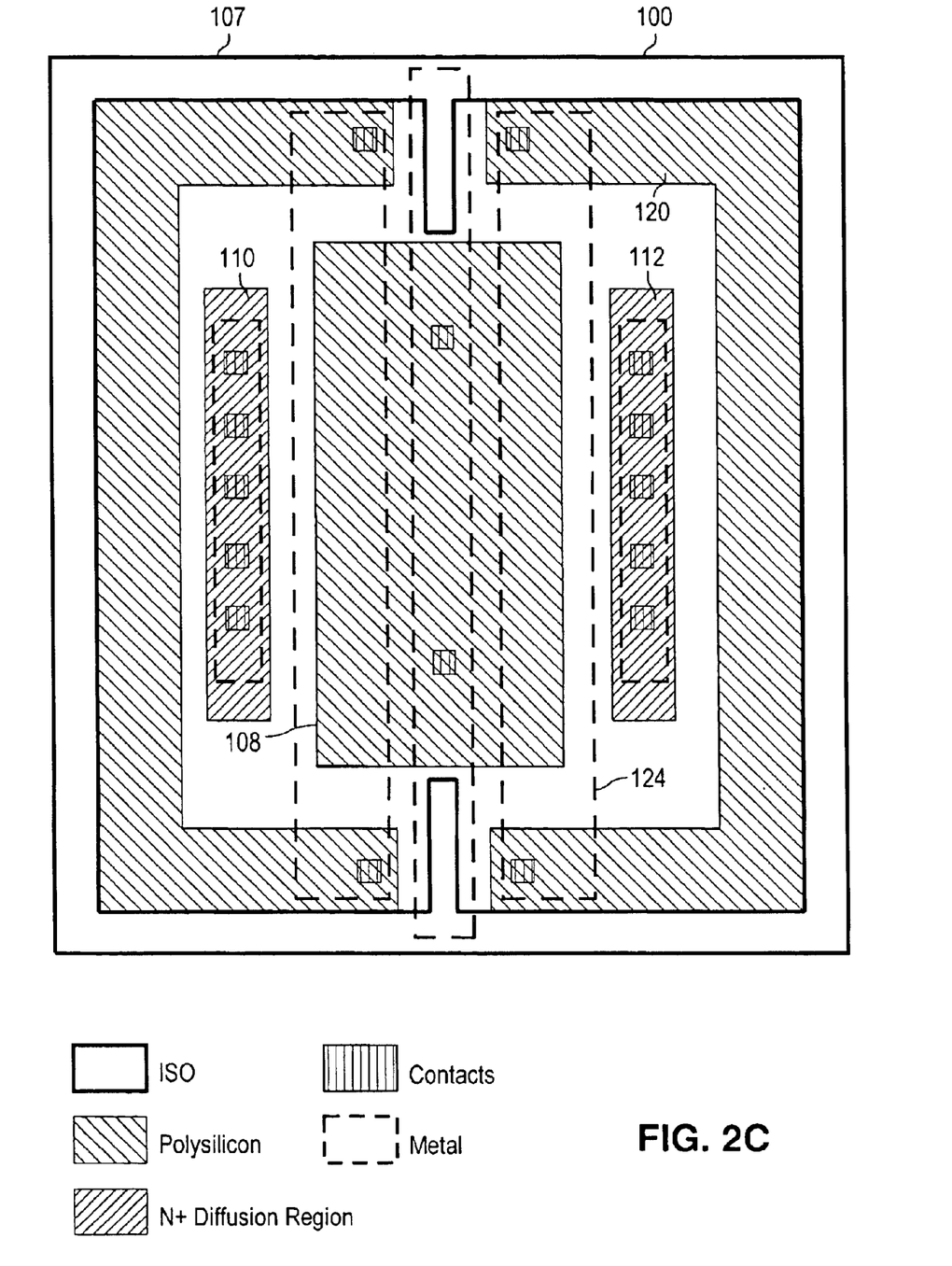
Figure 3:
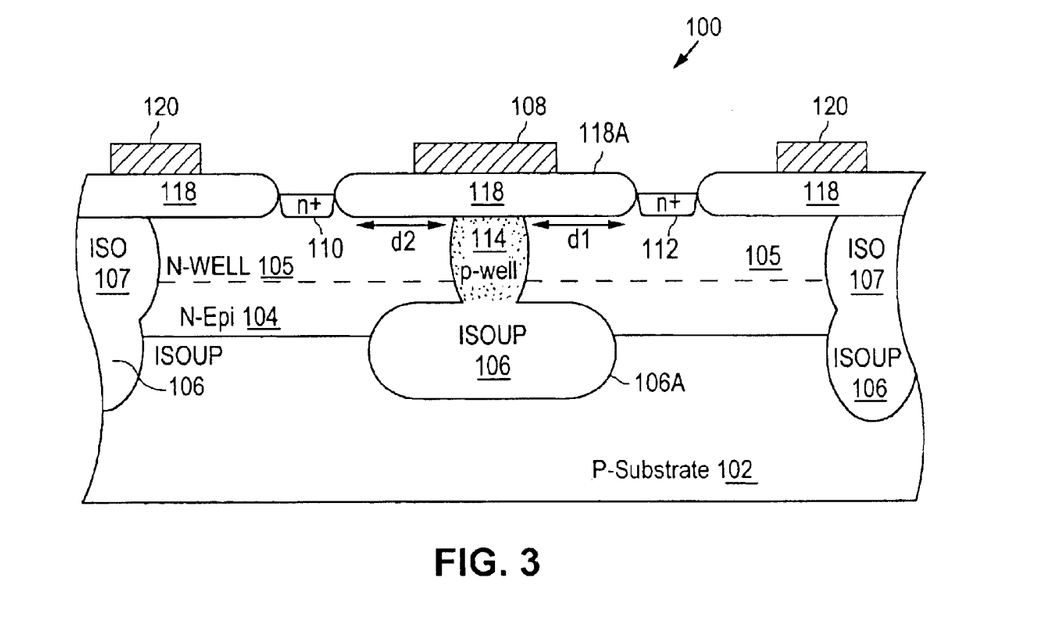
FIG. 3 is cross-sectional view of the LDMOS transistor of FIG. 2B along a line A-A'.

The LDMOS transistor of the present invention can be constructed using either a thin gate oxide layer or a thick gate oxide layer as the gate dielectric, depending on the desired applications. In either case, the LDMOS transistor of the present invention can receive high voltages applied to either the source or the drain terminal. In one embodiment of the present invention, the gate dielectric of the LDMOS transistor is formed using a field oxide layer and the LDMOS transistor is referred to as a field oxide gate LDMOS transistor. FIGS. 2A to 2C are top views of a field oxide gate N-type LDMOS transistor 100 illustrating selected regions of the transistor according to one embodiment of the present invention. A cross-sectional view of the LDMOS transistor in FIG. 2B along a line A-A' is shown in FIG. 3. Layers in the top view of FIGS. 2A to 2C that are the same as regions in the cross-sectional view of FIG. 3 are given the same reference numerals.

In the present embodiment, field oxide gate N-type LDMOS transistor 100 is built on a p-type substrate 102 having a resistivity of 5 to 10 ohm-cm. After forming ISOUP regions 106 which is a heavily doped p-type region, such by selectively implanting p-type dopants into substrate 102, an N-type epitaxial layer 104 of approximately 7.5 microns thick is grown on the surface of substrate 102 using conventional techniques. The resistivity of epitaxial layer 104 can be approximately 3 ohm-cm.

LDMOS transistor 100 includes N-well regions 105 and a P-well region 114 formed in epitaxial layer 104. N-well regions 105 and P-well 114 can be formed by conventional means, such as by masking selective regions and performing ion implantation using the appropriate dopants. N-well regions 105 are optional and in other embodiments, LDMOS transistor 100 can be formed directly in N-type epitaxial layer 104. However, the use of N-wells in transistor 100 has the advantage of lowering the on-resistance of the transistor. P-well 114 is the body region (that is, the channel region) of LDMOS transistor 100 and in the present embodiment, has a width of about $10\mu$. The bottom surface of P-well 114 abuts an ISOUP region 106A which provides a conductive path between P-well 114 and p-type substrate 102. Thus, in the present embodiment, the body of LDMOS transistor 100 (P-well 114) is electrically connected to p-type substrate 102 and is electrically grounded in operation.

After formation of the well regions, an implantation step is performed to form ISO regions 107 having p-type conductivity. ISO regions 107 act as isolation structures for LDMOS transistor 100 and abuts ISOUP regions 106 where applicable.

Next, on the surface of N-type epitaxial layer 104, a field oxide layer 118 is formed to define the active regions and also to insulate a polysilicon gate 108 from the substrate. In the present embodiment, a portion 118A of field oxide layer 118 formed over p-well 114 and under gate 108 acts as the entire gate dielectric of LDMOS transistor 100. The field oxide layer is typically thermally grown and in the present embodiment, has a thickness of approximately 6700 Å. Gate 108 is typically a polysilicon layer deposited and patterned using conventional techniques. As will become apparent in the following description, the use of a field oxide layer 118A as the gate dielectric layer has the effect of increasing the breakdown voltages between the gate terminal and the source and drain terminals and between the gate terminal and the substrate of LDMOS transistor 100.

In the present embodiment, a polysilicon guard ring 120 is formed on field oxide layer 118 and encircles the perimeter of LDMOS transistor 100, as shown in FIGS. 2B and 2C. Polysilicon guard ring 120 acts as a field plate for reshaping the electric field at the junction of N-wells 105 and ISO regions 107 which has the effect of increasing the breakdown voltage of LDMOS transistor 100, as will be described in more detail below.

Using photo resist as a blocking mask, an N+ source region 110 and an N+ drain region 112 are formed in N-wells 105. Following the formation of the source/drain regions, other conventional processing steps may follow for forming electrical contacts and metal interconnections to various nodes in LDMOS transistor 100. FIG. 2B illustrates the location of contact holes 122 to the n+ diffusion regions and the polysilicon layer. FIG. 2C illustrates the metallization pattern that can be used in LDMOS transistor 100 of the present embodiment. Other processing steps, such as encapsulating the transistor with a passivation layer may also be included. In addition, the above description focuses on the processing steps for forming LDMOS transistor 100. However, in actual implementation, other processing steps may be included to form other devices on the same semiconductor substrate as the LDMOS transistor of the present invention.

Field oxide gate N-type LDMOS transistor 100 of the present invention provides many advantageous features not realized in conventional LDMOS devices and represents a significant improvement over conventional LDMOS devices for some high voltage applications.

First, referring to FIG. 3, as thus formed, LDMOS transistor 100 is a symmetrical structure. Specifically, both the source and the drain terminals include a drift region formed in N-wells 105 underneath field oxide layer 118A. In the present embodiment, the lengths of the drift regions, denoted "d1" and "d2", on either side of p-well body 114 are $12\mu$ each. As illustrated in FIG. 3, the source and drain terminals of the transistor have identical structures and can thus withstand the same level of high voltages. Therefore, the source and drain terminals of LDMOS transistor 100 of the present invention are interchangeable in operation.

Second, by using a thick oxide layer, such as the field oxide layer, as the gate dielectric, LDMOS transistor 100 can realize a very high breakdown voltage between the gate and source/drain terminal and between the gate and the body. For instance, for a 6000 Å field oxide layer, a breakdown voltage of approximately 600 volts can be attained.

Third, the provision of a drift region at both the source and drain terminals and the use of a thick oxide layer as the gate dielectric enable LDMOS transistor 100 to accept high voltages applied to any of the source, drain and gate terminals. The gate voltage swing is no longer limited by the breakdown voltage between the gate and the source terminal or the gate and the body. This is a marked improvement over conventional LDMOS devices where only the drain terminal can receive high voltages. The LDMOS transistor of the present invention can thus be used in applications where high voltage is applied to the gate terminal, such as when the gate terminal of the LDMOS transistor is driven by a high voltage PMOS transistor. In one embodiment, the gate, drain and source terminals of LDMOS transistor 100 can each receive voltages up to 160 volts. The body (that is, P-well 114) of LDMOS transistor is grounded through ISOUP 106A and substrate 102.

Fourth, in the present embodiment, polysilicon guard ring 120 is included in LDMOS transistor 100 to further increase the breakdown voltage of the transistor. Polysilicon guard ring 120 is electrically connected to ground and forms a depletion region underneath field oxide 118 adjacent ISO regions 107. The depletion region formed by polysilicon guard ring 120 merges with the depletion region formed at the junction of ISO regions 107 and N-well 105. The depletion region formed by the guard ring helps to increase the N-well to ISO breakdown voltage. Without the polysilicon guard ring, the breakdown voltage of the N-well to ISO junction at the field oxide edge can be as low as 80 volts. When the polysilicon guard ring is included, the breakdown voltage at the ISO/N-well junction can increase to 160 volts.

Lastly, the symmetrical structure of LDMOS transistor 100 enables the creation of a scalable device model that is geometry independent for use in device simulation, such as SPICE. Thus, more accurate device modeling can be achieved than previously possible with the use of conventional non-symmetrical structures.

In accordance with another aspect of the present invention, the threshold voltage of LDMOS transistor 100 is adjusted by varying the doping level of P-well 114. For example, in a conventional CMOS fabrication process, a channel stop implant is usually carried out to introduce p-type dopants in p-wells under the field oxide layer between n+ active regions in the p-well. The introduction of the channel stop implant increases the threshold voltage of p-wells that are under the field oxide layer to inhibit parasitic transistor actions. In accordance with one embodiment of the present invention, the field oxide gate LDMOS transistor is fabricated by blocking the channel stop implant from P-well 114 such that the intrinsic threshold voltage of the P-well is retained. For instance, in one embodiment, the intrinsic threshold voltage of P-well 114 is about 12 volts. When channel stop implant is introduced, the threshold voltage of the P-well can be increased up to 20 volts. However, in the present embodiment, the channel stop implant is blocked from P-well 114 specifically so that the intrinsic threshold voltage of 12 volts is retained. In this manner, the LDMOS transistor of the present invention can be turned on at lower gate voltages and can draw a higher drain current at the same gate voltage as compared to devices that receive the channel stop implant.

Figure 4:
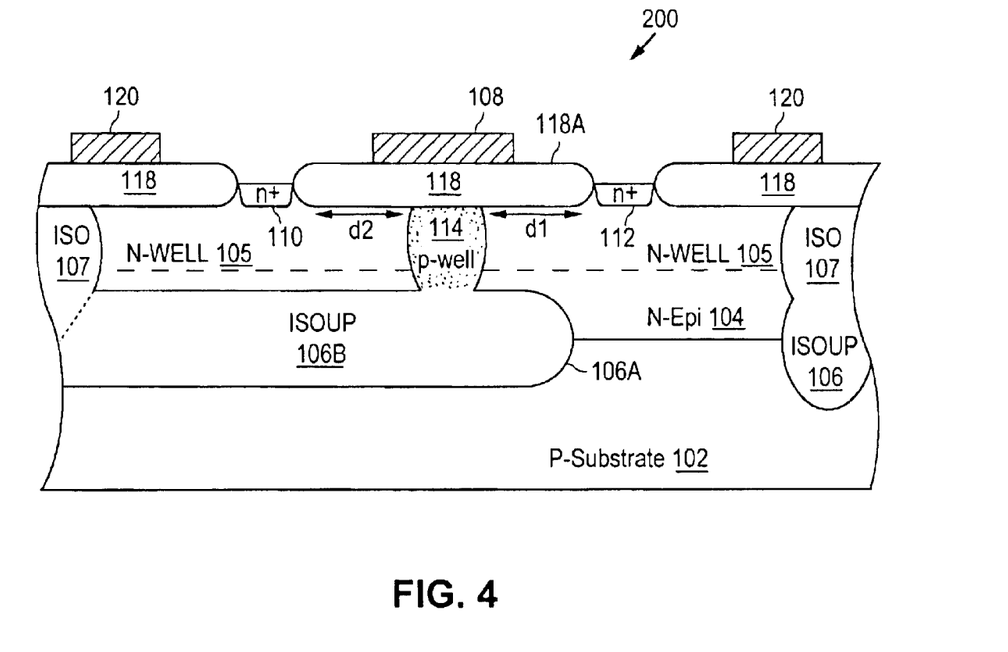
FIG. 4 is cross-sectional view of a Field Oxide Gate N-type LDMOS transistor according to another embodiment of the present invention.

FIG. 4 is cross-sectional view of a Field Oxide Gate N-type LDMOS transistor according to another embodiment of the present invention. Referring to FIG. 4, field oxide gate N-type LDMOS transistor 200 is constructed in a similar manner as LDMOS transistor 100. Like elements in FIGS. 3 and 4 are given like reference numerals and will not be further described. In LDMOS transistor 200, an ISOUP region 106B, which electrically couples P-well 114 to substrate 102, is formed as a contiguous region under source terminal 110 and P-well 114 of the LDMOS transistor. ISOUP region 106B functions to lower the body resistance of LDMOS transistor 200. As thus formed, the source terminal of LDMOS transistor 200 can handle high voltages but at a lower voltage level than that can be handled by the drain terminal. For example, in one embodiment, the drain terminal can receive up to 160 volts of applied voltage while the source terminal can only receive up to 80 volts of applied voltage. The limitation on the applied voltage level at the source terminal is due to the lower breakdown between N-well 105 underneath source terminal 110 and ISOUP region 106B. LDMOS transistor 200 may be used when interchangeability between the source and drain terminals of the transistor is not critical.

In FIGS. 3 and 4, the drift region length "d1" between the body (P-Well 114) and the drain (n+ region 112) and the drift region length "d2" between the body and the source (n+ region 110) are the same. However, in other embodiments, the drift region lengths d1 and d2 do not have to be equal, that is, the drift region lengths can be different. In one embodiment, when the source side is not required to handle the same voltage levels as the drain side, the drift region length d2 (source side) can be made shorter than drift region length d1 (drain side).

In the above embodiments, the field oxide layer is used as the gate dielectric for the LDMOS transistor of the present invention. While the use of the field oxide layer has advantages in simplifying the processing and ensuing compatibility with conventional fabrication processes, the use of field oxide layer as the gate dielectric is illustrative only and is not intended to be limiting. In other embodiments, the gate dielectric of the LDMOS transistor can be formed using other thick oxide layers that are available in the fabrication process or the thick oxide layer can be formed using dedicated process steps. In general, the thick oxide layer should have a thickness sufficient to sustain the high voltage level desired for the application. For instance, an oxide layer thickness in the range of a few hundred up to several thousand angstroms is usually desired. In some embodiments, the thickness of the oxide layer can range from 80 Å to 6000 Å. Furthermore, the thick oxide layer can be formed by any means, such as by dry or wet thermal oxidation.

Figure 5:
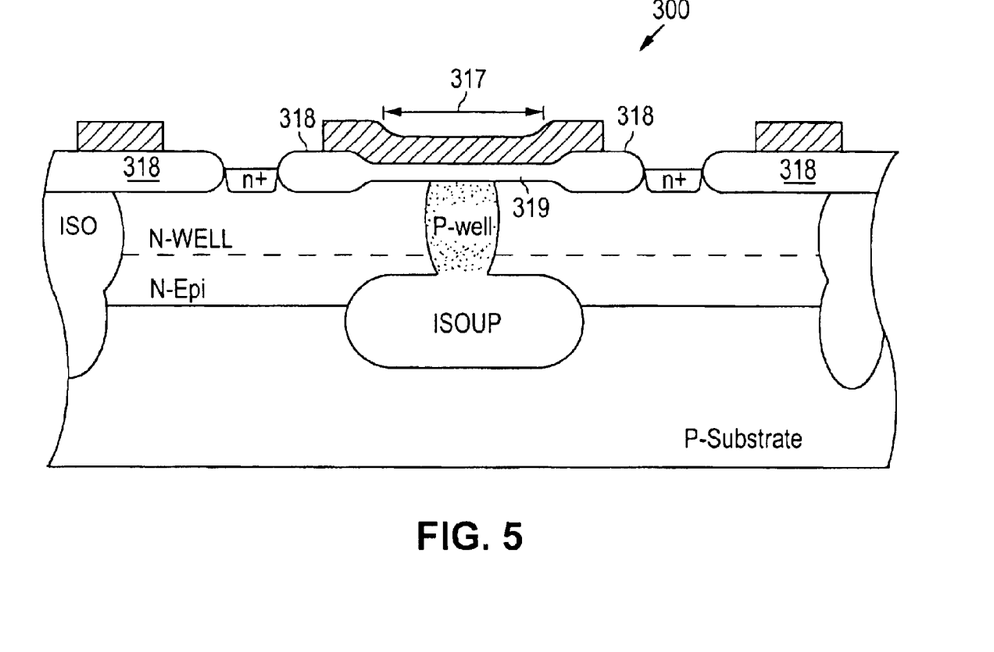
FIG. 5 is a cross-sectional view of an N-type LDMOS transistor according to another embodiment of the present invention.

FIG. 5 is a cross-sectional view of an N-type LDMOS transistor according to another embodiment of the present invention. Referring to FIG. 5, LDMOS transistor 300 is constructed in a similar manner as LDMOS transistor 100 of FIG. 3 except that LDMOS transistor 300 includes a thick oxide layer 319 as the gate dielectric. Oxide layer 319 is thicker than the gate oxide layer used for the conventional low voltage MOSFET devices but thinner than the field oxide layer. In one embodiment, oxide layer 319 has a thickness of about 4000 Å. Various methods can be used to form oxide layer 319 in LDMOS transistor 300. In one embodiment, a self-aligned process can be used. First, a field oxide layer 318 is formed on the surface of the substrate defining the active regions and the channel region of the LDMOS transistor (denoted by area 317). Then, a mask can be applied covering the surface of the substrate except for the channel region 317 of LDMOS transistor 300. Next, an oxidation process can be carried out to form oxide layer 319 in area 317 having the desired thickness. Thus, field oxide layer 318 encircles oxide layer 319 and oxide layer 319 is self-aligned to the field oxide layer.

Figure 6:
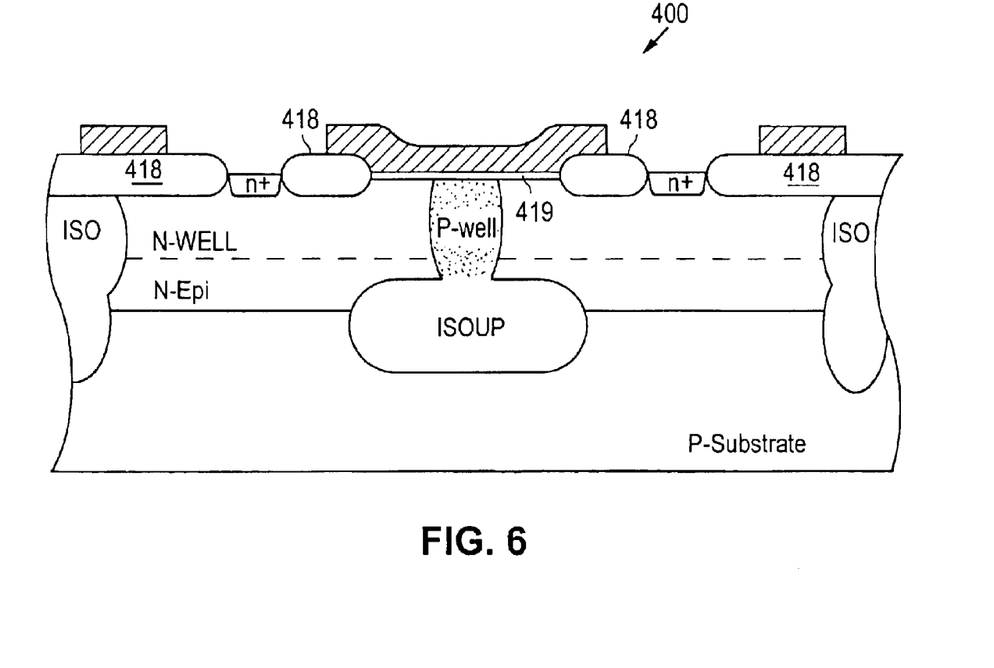
FIG. 6 is a cross-sectional view of an N-type LDMOS transistor according to yet another embodiment of the present invention.

According to another aspect of the present invention, the gate dielectric of the LDMOS transistor is formed using a thin gate oxide layer, as shown in FIG. 6. Referring to Figure 6, LDMOS transistor 400 includes a thin gate oxide layer 419 encircled by field oxide layer 418. The thin gate oxide layer can be the same gate oxide layer used as the gate dielectric for other low voltage MOSFET devices on the integrated circuit. LDMOS transistor 400 is useful when the gate terminal does not have to receive high voltages. In this case, LDMOS transistor 400 is constructed where both the source and drain terminals can receive high voltages and are interchangeable in operation.

According to another aspect of the present invention, the LDMOS transistor of the present invention can be integrated with other low voltage devices on the same integrated circuit. In one embodiment, when an N-type LDMOS transistor of the present invention is built with other low voltage devices on the same silicon substrate, the P-well body of the LDMOS transistor is built using a lightly doped P-well while the low voltage devices are built using standard, more heavily doped, P-wells. The use of a lightly doped P-well and a standard P-well in a fabrication process to built high voltage and low voltage devices is described in concurrently filed and commonly assigned U.S. patent application Ser. No. 10/323,695, entitled "An Integrated Circuit Including High Voltage Devices And Low Voltage Devices", of the same inventor hereof, which patent application is incorporation herein by reference in its entirety. The use of a lightly doped P-well as the P-well body of the, LDMOS transistor enhances the breakdown voltage characteristics of the LDMOS transistor.

The above detailed descriptions are provided to illustrate specific embodiments of the present invention and are not intended to be limiting. Numerous modifications and variations within the scope of the present invention are possible. For example, in the above embodiments, an N-type LDMOS transistor is described. One of ordinary skill in the art would appreciate that a P-type LDMOS transistor can be constructed using the same principles as described herein by reversing the polarities of the diffusion regions accordingly. The present invention is defined by the appended claims.

I claim:

1. A transistor, comprising:
   a semiconductor layer of a first conductivity type;
   a first well of a second conductivity type formed in the semiconductor layer, the first well forming a body region of the transistor;
   a field oxide layer formed on the top surface of the semiconductor layer, a portion of the field oxide layer being formed over the first well and remaining portions of the field oxide layer being formed over the semiconductor layer on either side of the first well, the field oxide layer forming a gate dielectric layer of the transistor;
   a conductive gate formed over the field oxide layer and located above the first well;
   a first region of the first conductivity type formed in the semiconductor layer abutting a first edge of the field oxide layer; and
   a second region of the first conductivity type formed in the semiconductor layer abutting a second edge of the field oxide layer opposite the first edge,
   wherein a first drift region between the body region and the first region is formed in the semiconductor layer underlying the field oxide layer between a first edge of the first well to the first edge of the field oxide layer; and
   wherein a second drift region between the body region and the second region is formed in the semiconductor layer underlying the field oxide layer between a second edge of the first well, opposite the first edge of the first well, to the second edge of the field oxide layer.

2. The transistor of claim 1, wherein either the first region or the second region forms a source region of the transistor and the other one of the first and second regions forms a drain region of the transistor.

3. The transistor of claim 1, wherein the field oxide layer is centered above the first well and the first and second drift regions have the same length.

4. The transistor of claim 1, wherein the first drift region has a first length and the second drift region has a second length different than the first length.

5. The transistor of claim 1, wherein the semiconductor layer of a first conductivity type is an epitaxial layer of the first conductivity type formed on a semiconductor substrate of the second conductivity type.

6. The transistor of claim 5, further comprising:
   a third region of the second conductivity type formed in the semiconductor substrate and the epitaxial layer and positioned underneath the first well,
   wherein the third region forms a conductive path between the first well and the semiconductor substrate.

7. The transistor of claim 5, further comprising:
   a third region of the second conductivity type formed in the semiconductor substrate and the epitaxial layer, the third region underlying the first well and the first region,
   wherein the third region forms a conductive path between the first well and the semiconductor substrate.

8. The transistor of claim 1, further comprising:
   a plurality of second well regions of the first conductivity type formed in the semiconductor layer and being self-aligned with the first well, the first region and the second region being formed in a respective one of the second well regions.

9. A transistor, comprising:
   a semiconductor layer of a first conductivity type;
   a first well of a second conductivity type formed in the semiconductor layer, the first well forming a body region of the transistor;
   a first dielectric layer formed on the top surface of the semiconductor layer as a gate dielectric layer of the transistor, a portion of the first dielectric layer being formed over the first well and remaining portions of the first dielectric layer being formed over the semiconductor layer on either side of the first well;
   a second dielectric layer formed on the top surface of the semiconductor layer and encircling the first dielectric layer;
   a conductive gate formed over the first dielectric layer and located above the first well;
   a first region of the first conductivity type formed in the semiconductor layer abutting a first edge of the second dielectric layer;
   a second region of the first conductivity type formed in the semiconductor layer abutting a second edge of the second dielectric layer opposite the first edge; and
   a plurality of second well regions of the first conductivity type formed in the semiconductor layer and being self-aligned to the first well, the first region and the second region being formed in a respective one of the second well regions,
   wherein a first drift region between the body region and the first region is formed in the semiconductor layer between a first edge of the first well to the first edge of the second dielectric layer, and a second drift region between the body region and the second region is formed in the semiconductor layer between a second edge of the first well, opposite the first edge of the first well, to the second edge of the second dielectric layer.

10. The transistor of claim 9, wherein either the first region or the second region forms a source region of the transistor and the other one of the first and second regions forms a drain region of the transistor.

11. The transistor of claim 9, wherein the first dielectric layer is centered above the first well and the first and second drift regions have the same length.

12. The transistor of claim 9, wherein the first drift region has a first length and the second drift region has a second length different than the first length.

13. The transistor of claim 9, wherein the second dielectric layer comprises a field oxide layer.

14. The transistor of claim 13, wherein the second dielectric layer and the first dielectric layer comprise a contiguous field oxide layer.

15. The transistor of claim 14, wherein the first and second dielectric layers have a thickness of about 6500 Å.

16. The transistor of claim 13, wherein the first dielectric layer comprises a gate oxide layer.

17. The transistor of claim 13, wherein the first dielectric layer comprises a thick oxide layer having a thickness less than the second dielectric layer.

18. The transistor of claim 9, wherein the semiconductor layer of a first conductivity type is an epitaxial layer of the first conductivity type formed on a semiconductor substrate of the second conductivity type.

19. The transistor of claim 18, further comprising:
a third region of the second conductivity type formed in the semiconductor substrate and the epitaxial layer and positioned underneath the first well,
wherein the third region forms a conductive path between the first well and the semiconductor substrate.

20. The transistor of claim 19, wherein the semiconductor substrate is electrically coupled to a ground potential and the body region of the transistor is electrically coupled to the ground potential through the third region and the semiconductor substrate.

21. The transistor of claim 18, further comprising:
a third region of the second conductivity type formed in the semiconductor substrate and the epitaxial layer, the third region underlying the first well and the first region,
wherein the third region forms a conductive path between the first well and the semiconductor substrate.

22. The transistor of claim 9, wherein said first conductivity type is n-type and said second conductivity type is p-type.

23. The transistor of claim 22, wherein the semiconductor layer includes a plurality of P-wells for forming other devices, and wherein the first well is a lightly doped P-well and the plurality of P-wells are more heavily doped than the first well.

24. The transistor of claim 9, further comprising:
a field oxide region surrounding the outer perimeter of the transistor, the field oxide region having a first edge abutting an outside edge of the first region and a second edge abutting an outside edge of the second region; and
a polysilicon layer formed over the field oxide region and surrounding the outer perimeter of the transistor, the polysilicon layer forming a guard ring for the transistor.

25. The transistor of claim 24, wherein the polysilicon layer is electrically coupled to a ground potential.

26. The transistor of claim 9, wherein the threshold voltage of the transistor is an intrinsic threshold voltage of the first well determined by the doping level of the first well unaltered by any additional doping.

27. An integrated circuit formed using a fabrication process that includes a gate oxide layer used to form low voltage MOSFET devices, the gate oxide layer having a first thickness, the integrated circuit comprising:
a semiconductor layer of a first conductivity type;
a first transistor and a second transistor formed in the semiconductor layer, the first transistor being a low voltage MOSFET device formed using the gate oxide layer having the first thickness as a gate dielectric layer; and the second transistor comprising;
a first well of a second conductivity type formed in the semiconductor layer, the first well forming a body region of the second transistor;
a thick oxide layer formed on the top surface of the semiconductor layer, a portion of the thick oxide layer being formed over the first well and remaining portions of the thick oxide layer being formed over the semiconductor layer on either side of the first well, the thick oxide layer forming a gate dielectric layer of the second transistor, wherein the thick oxide layer has a second thickness substantially greater than the first thickness of the gate oxide layer used to form the first transistor;
a conductive gate formed over the thick oxide layer and located above the first well;
a first region of the first conductivity type formed in the semiconductor layer abutting a first edge of the thick oxide layer; and
a second region of the first conductivity type formed in the semiconductor layer abutting a second edge of the thick oxide layer opposite the first edge,
wherein a first drift region between the body region and the first region of the second transistor is formed in the semiconductor layer underlying the thick oxide layer between a first edge of the first well to the first edge of the thick oxide layer; and
wherein a second drift region between the body region and the second region of the second transistor is formed in the semiconductor layer underlying the thick oxide layer between a second edge of the first well, opposite the first edge of the first well, to the second edge of the thick oxide layer.

28. The integrated circuit of claim 27, wherein the thick oxide layer comprises a field oxide layer.

29. The integrated circuit of claim 27, wherein either the first region or the second region forms a source region of the second transistor and the other one of the first and second regions forms a drain region of the second transistor.

30. The integrated circuit of claim 27, wherein the semiconductor layer of a first conductivity type is an epitaxial layer of the first conductivity type formed on a semiconductor substrate of the second conductivity type.

31. The integrated circuit of claim 27, further comprising:
a plurality of second well regions of the first conductivity type formed in the semiconductor layer and being self-aligned with the first well, the first region and the second region being formed in a respective one of the second well regions.

32. A method for forming a transistor, comprising:
providing a semiconductor layer of a first conductivity type;
forming a first well of a second conductivity type in the semiconductor layer, the first well forming a body region of the transistor;
forming a plurality of second wells of the first conductivity type in the semiconductor layer, the plurality of second wells being self-aligned to the first well;

forming a dielectric layer on the top surface of the semiconductor layer and over the first well, the dielectric layer forming a gate dielectric layer of the transistor and comprising a first portion and a second portion encircling the first portion;

forming a first region of the first conductivity type in a first one of the second wells in the semiconductor layer abutting a first edge of the dielectric layer;

forming a second region of the first conductivity type in a second one of the second wells in the semiconductor layer abutting a second edge of the dielectric layer opposite the first edge; and forming a conductive gate over the dielectric layer and located above the first well, wherein a first drift region between the body region and the first region is formed in the semiconductor layer underlying the dielectric layer between a first edge of the first well to the first edge of the dielectric layer; and wherein a second drift region between the body region and the second region is formed in the semiconductor layer underlying the dielectric layer between a second edge of the first well, opposite the first edge of the first well, to the second edge of the dielectric layer.

33. The method of claim 32, wherein the dielectric layer comprises a field oxide layer.

34. The method of claim 32, wherein the first portion of the dielectric layer comprises a gate oxide layer and the second portion of the dielectric layer comprises a field oxide layer.

35. The method of claim 32, wherein the transistor comprises a first transistor and the first transistor is formed in an integrated circuit formed using a fabrication process that include a gate oxide layer for forming low voltage MOSFET devices, the integrated circuit further including a second transistor being a low voltage MOSFET device formed using the gate oxide layer as a gate dielectric layer, and the first portion of the dielectric layer of the first transistor comprises a thick oxide layer and the second portion of the dielectric layer of the first transistor comprises a field oxide layer, the thick oxide layer having a thickness less than the field oxide layer and greater than the gate oxide layer of the second transistor.

36. A method for forming an integrated circuit using a fabrication process that includes a gate oxide layer used to form low voltage MOSFET devices, the method comprising:

providing a semiconductor layer of a first conductivity type;

forming a first transistor in the semiconductor layer, the first transistor being a low voltage MOSFET device formed using the gate oxide layer as a gate dielectric layer; and forming a second transistor in the semiconductor layer, wherein forming the second transistor comprises:

forming a first well of a second conductivity type in the semiconductor layer, the first well forming a body region of the second transistor;

forming a thick oxide layer on the top surface of the semiconductor layer and over the first well, the thick oxide layer forming a gate dielectric layer of the second transistor; and having a thickness greater than the gate oxide layer of the first transistor, forming a first region of the first couductivity type in the semiconductor layer abutting a first edge of the thick oxide layer;

forming a second region of the first conductivity type in the semiconductor layer abutting a second edge of the thick oxide layer opposite the first edge; and forming a conductive gate over the thick oxide layer and located above the first well, wherein a first drift region between the body region and the first region of the second transistor is formed in the semiconductor layer underlying the thick oxide layer between a first edge of the first well to the first edge of the thick oxide layer; and wherein a second drift region between the body region and the second region of the second transistor is formed in the semiconductor layer underlying the thick oxide layer between a second edge of the first well, opposite the first edge of the first well, to the second edge of the thick oxide layer.

37. The method of claim 36, wherein the thick oxide layer comprises a field oxide layer.

\* \* \* \* \*